United States Patent
Ku et al.

(10) Patent No.: US 8,614,112 B2
(45) Date of Patent: Dec. 24, 2013

(54) METHOD OF DAMAGE-FREE IMPURITY DOPING FOR CMOS IMAGE SENSORS

(75) Inventors: Keh-Chiang Ku, Cupertino, CA (US);
Chia-Ying Liu, Hsinchu (TW);
Hsin-Chih Tai, San Jose, CA (US);
Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 357 days.

(21) Appl. No.: 12/896,518

(22) Filed: Oct. 1, 2010

(65) Prior Publication Data

US 2012/0080765 A1 Apr. 5, 2012

(51) Int. Cl.
*H01L 31/0232* (2006.01)
*H01L 31/18* (2006.01)

(52) U.S. Cl.
USPC .............. 438/73; 257/E31.054; 257/E31.127

(58) Field of Classification Search
USPC ........... 257/292, E27.132, E27.133, E31.054, 257/E31.123; 438/69, 73
See application file for complete search history.

(56) References Cited

U.S. PATENT DOCUMENTS

| 4,454,526 A * | 6/1984 | Nishizawa et al. ............ 257/292 |
| 4,545,526 A * | 10/1985 | Ido et al. .................. 237/12.3 A |
| 7,741,666 B2 | 6/2010 | Nozaki et al. |
| 2009/0124038 A1 * | 5/2009 | Tuttle ............................... 438/70 |
| 2009/0200587 A1 * | 8/2009 | Venezia et al. ................ 257/292 |

OTHER PUBLICATIONS

Chang-Rok Moon et al., "Application of Plasma-Doping (PLAD) Technique to Reduce Dark Current of CMOS Image Sensors," IEEE Electron Device Letters, vol. 28, No. 2, Feb. 2007, pp. 114-116.
S. K. Baek et al., "Ultrashallow P+/N Junction Formation by Plasma Ion Implantation," Journal of Korean Physical Society, vol. 37, No. 6, Dec. 2000, pp. 912-914.

* cited by examiner

*Primary Examiner* — Colleen Matthews
(74) *Attorney, Agent, or Firm* — Blakely Sokoloff Taylor & Zafman LLP

(57) ABSTRACT

A method of fabricating a backside-illuminated pixel. The method includes forming frontside components of the pixel on or in a front side of a substrate, the frontside components including a photosensitive region of a first polarity. The method further includes forming a pure dopant region of a second polarity on a back side of the substrate, applying a laser pulse to the backside of the substrate to melt the pure dopant region, and recrystallizing the pure dopant region to form a backside doped layer. Corresponding apparatus embodiments are disclosed and claimed.

6 Claims, 6 Drawing Sheets

METHOD OF DAMAGE-FREE IMPURITY DOPING FOR CMOS IMAGE SENSORS

TECHNICAL FIELD

This disclosure relates generally to image sensors and in particular, but not exclusively, to backside illuminated ("BSI") image sensors with improved backside surface doping.

BACKGROUND

Image sensors have become ubiquitous. They are widely used in digital still cameras, cellular phones, security cameras, medical, automobile, and other applications. The technology used to manufacture image sensors, and in particular CMOS image sensors ("CIS"), has continued to advance at great pace. For example, the demands of higher resolution and lower power consumption have encouraged the further miniaturization and integration of the image sensor. Thus, the number of pixels in the pixel array of the image sensor has increased, while the size of each pixel cell has decreased.

Typically each pixel of an image sensor includes a photosensitive element such as a photodiode, and one or more transistors for reading out the signal from the photosensitive element. As pixel cell size decreases, transistor sizes may decrease as well. A transfer transistor is commonly used in a pixel with a four-transistor design. The transfer transistor separates the photosensitive element from the rest of the pixel. The transfer transistor is formed between the photosensitive element and a floating node and it is desirable to scale down the transfer transistor to have a short gate length for reasons of greater integration and enhanced pixel fill factor.

In most image sensors, the constituent elements of each pixel are formed on or near what is considered the front surface of a silicon substrate, and the light to be captured by the pixels is incident on the front surface. Some image sensors known as backside-illuminated (BSI) image sensors can capture light incident on the back surface of the substrate instead of, or in addition to, capturing light incident on the front side of the substrate. In BSI image sensors, backside illumination causes the majority of photon absorption to occur near the backside silicon surface. To separate the electron-hole pairs created by photon absorption and drive the electrons toward a photosensitive region, an electric field near the back silicon surface is helpful. This electric field can be created by doping the back surface of the silicon. The quality of the doped back surface plays an important role in image sensor performance. Crystal defects and inactive dopants in the doped back surface region can degrade quantum efficiency by trapping electrons and not allowing them to reach the photosensitive region, which can result in "hot pixel" defects.

One of the major sources of crystal defects in CMOS image sensors is a result of the conventional ion implantation process, which involves dopant implantation followed by a thermal anneal to activate the implanted dopants. Thermal laser anneal is one method used to reduce the occurrence of crystal defects after ion implantation, but laser annealing creates localized heating, which can cause a significant increase in substrate temperature for a BSI CIS, since in these types of image sensors, the epitaxial (epi) layer in which the pixel is primarily formed is thin (e.g., <4 μm thick). An increase in substrate temperature can result in unintended dopant diffusion and/or metal deterioration/melting. The potential for excess heating of unintended regions may be reduced by using a thicker final epi layer, which can result by removing less of the epi layer during the substrate thinning process. However, increasing the thickness of the epi layer results in an increase in electrical crosstalk between adjacent pixels in an image sensor.

In addition to creating an increase in substrate temperature, laser anneal can also fail to activate all the backside dopant, which can result in inactive-dopant defects. These problems associated with the current fabrication process, which employs ion implantation and laser thermal annealing, can cause undesirable problems in the resulting image sensors, such as high dark current and high white pixel count.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION OF THE ILLUSTRATED EMBODIMENTS

Embodiments of a method for producing damage-free impurity doping of a backside-illuminated ("BSI") image sensor are described herein. In the following description, numerous specific details are described to provide a thorough understanding of embodiments of the invention, but one skilled in the relevant art will recognize that the invention can be practice without one or more of the specific details, or with other methods, components, materials, etc. In other instances, well-known structures, materials or operations are not shown or described in details but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, particular features, structures, or characteristics may be combined in any suitable manner in one or more embodiments. Directional terminology such as "top," "bottom," "under" is used with reference to the orientation of the figure(s) being described, but should not be interpreted as any kind of limitation on the orientation of the embodiments.

Figure 1:
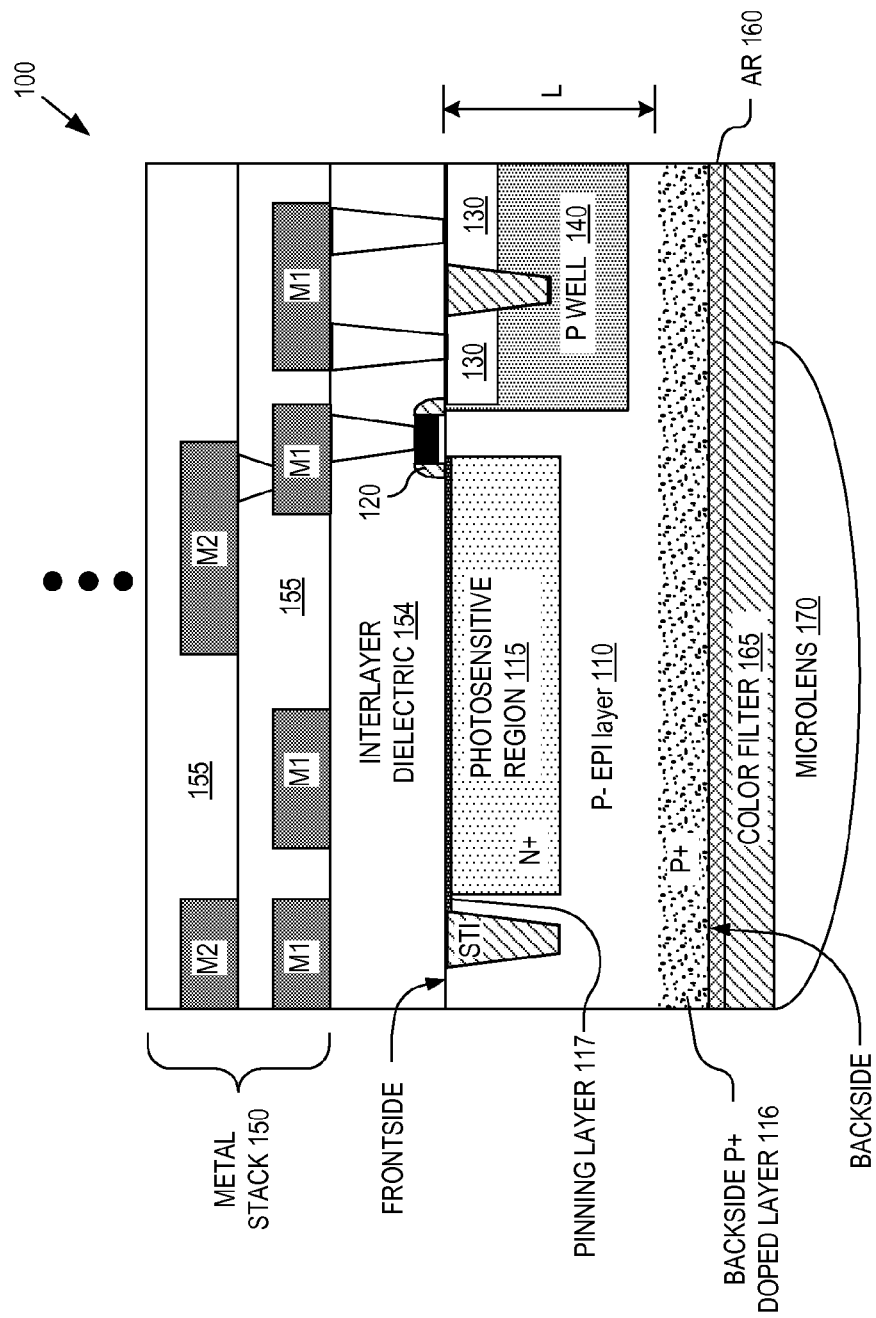
FIG. 1 is a cross-sectional view of an embodiment of a backside-illuminated image sensor having a backside dopant layer.

FIG. 1 is a cross-sectional view of an embodiment of an image pixel 100 of a backside-illuminated (BSI) image sensor having a backside dopant. The illustrated embodiment of image pixel 100 is one possible implementation of a pixel within a pixel array of an image sensor. The illustrated embodiment of image pixel 100 includes p-type epi layer 110, p-type pinning layer 117, n-type photosensitive region 115, transfer transistor 120, as well as shallow trench isolation ("STI") and n+ source/drain diffusion 130 which are formed on the frontside of epi layer 110. N+ source/drain diffusions 130 are formed within p-well 140. Of course, in other embodiments the conductivity types of the elements of pixel 100 can be flipped. For example, in an alternative embodiment, regions 115, 130 can be doped P-type, while regions 110, 140 and 116 can be doped N-type.

Interlayer dielectric 154 separates the frontside surface of epi layer 110 from metal stack 150. Although FIG. 1 illustrates a two-layer metal stack, metal stack 150 can include more or less metal layers for routing electrical signals over the frontside of the pixel array. Backside p+ doped layer 116 is formed on the backside of epitaxial (epi) layer 110 of thickness L. An optional anti-reflective ("AR") layer 160 can be formed on the backside of backside p+ doped layer 116. Color filter 165 can be formed on the backside of AR layer 160, and can have a Bayer pattern, or include an infrared filter, or a combination of the two. In other embodiments, color filter 165 can be absent altogether. Microlens 170 is formed on the backside of image pixel 100, and directs light from the backside surface towards n-type photosensitive region 115.

Figure 2:
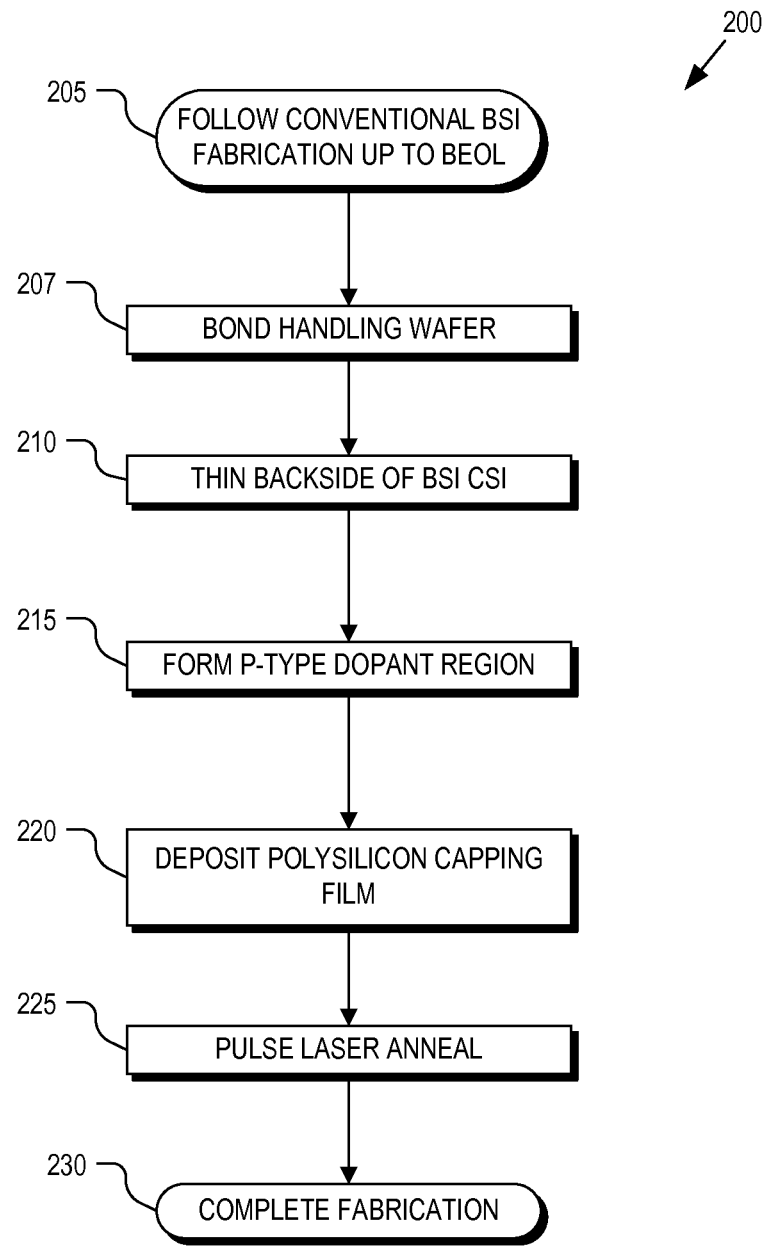
FIG. 2 is a flow chart illustrating an embodiment of a process for fabricating a backside illuminated image sensor.

FIG. 2 is a flow chart illustrating an embodiment of a process 200 for fabricating an image pixel 300 of a BSI image sensor (see FIGS. 3A-3D). The order in which some or all of the process blocks appear in process 200 should not be viewed as limiting. Rather, one of ordinary skill in the art having the benefit of the present disclosure will understand that some of the process blocks may be executed in a variety of orders not illustrated.

Figure 3A:
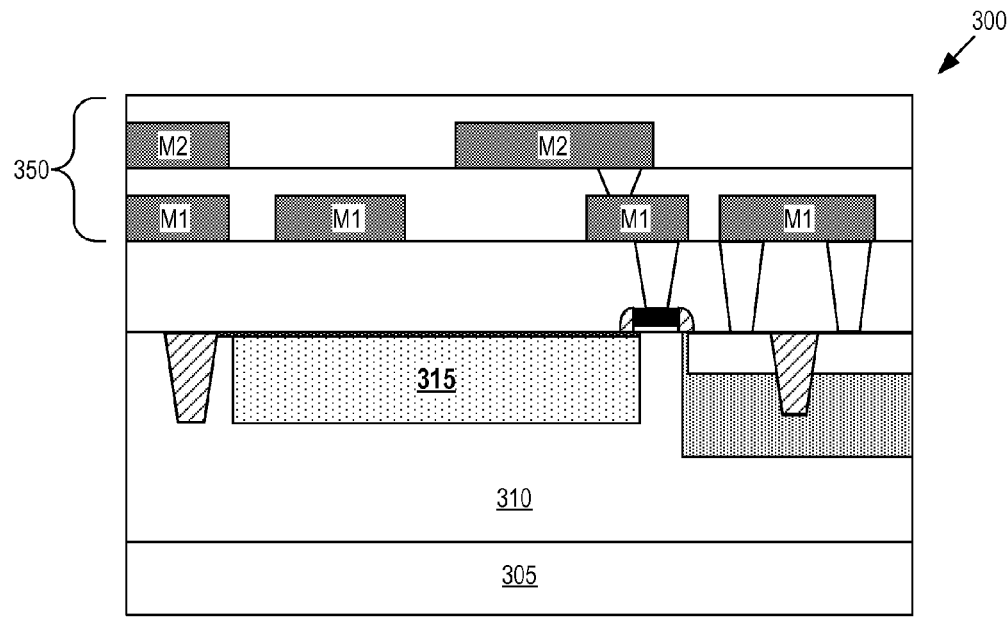
FIG. 3A is a cross-sectional view of a partially fabricated embodiment of a backside-illuminated image sensor fabricated up to the completion of the frontside interconnects.

In process block 205, the fabrication of image pixel 300 follows conventional techniques up to fabrication of the back-end-of-the-line ("BEOL") components, including diffusion implants, silicides, pixel transistor circuitry and metal stack 350 as shown in FIG. 3A. FIG. 3A also shows epi layer 310 formed on a p+ substrate 305. In process block 207, a handling wafer (not shown in FIGS. 3A-3D) is bonded to the frontside image sensor wafer. In process block 210, image pixel 300 is backside-thinned to remove p+ substrate 305 and to expose a backside of p-type epi layer 310.

Figure 3B:
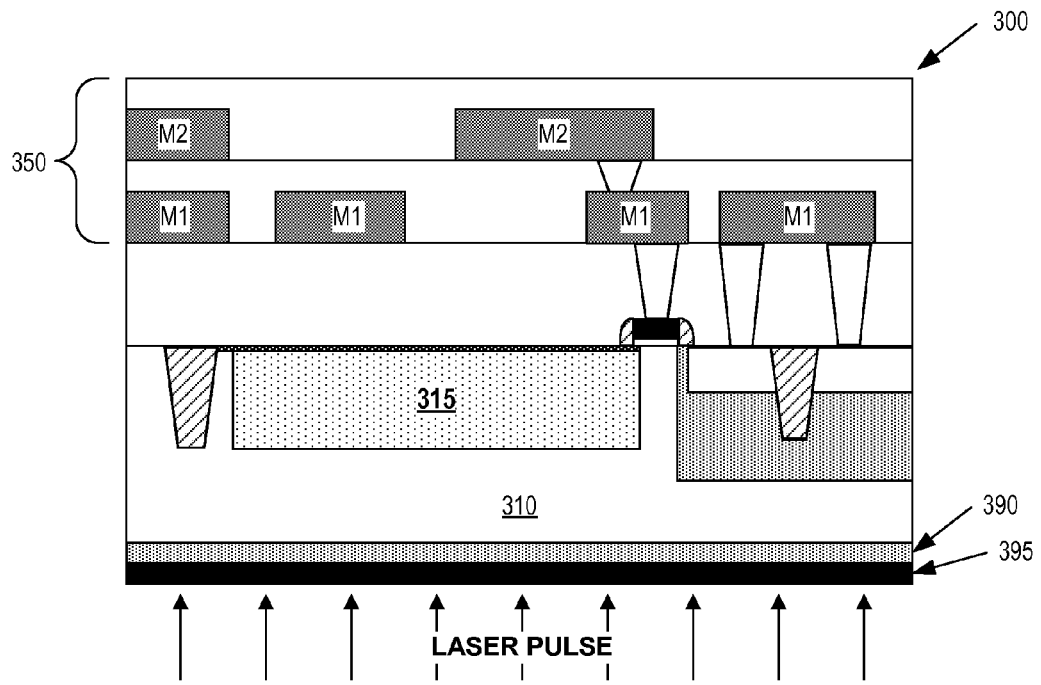
FIG. 3B is a cross-sectional view of a partially fabricated embodiment of a backside-illuminated image sensor fabricated up to the deposition of a dopant region and polysilicon capping film.

In process block 215, a pure p-type dopant region 390 is formed in or on the backside of p-type epi layer 310 using a Plasma Immersion Ion Implantation ("PIII") process (see FIG. 3B). As used herein, the term "pure" used in reference to the dopant region does not mean that the dopant region must be made of 100 percent of the selected dopant with no impurities. Instead, "pure" means that the dopant region is made up primarily of the selected dopant but can contain one or more impurities in any amount, so long as the impurities do not occur in an amount that would interfere with the formation of dopant region 390 using the PIII process, interfere with the later formation of backside doped layer 316, or interfere with operation of the resulting pixel. In PIII, the surface of p-type epi layer 310 is exposed to a plasma, and a high negative voltage is applied to form an electric field between the surface of p-type epi layer 310 and the plasma. The electric field accelerates p-type dopant ions from the plasma towards the surface of p-type epi layer, thereby implanting the ions. In one embodiment the dopant ions can be boron, but in other embodiments other types of dopants can be used. Using this process, pure p-type dopant region 390 is formed on the backside of p-type epi layer 310. Generally, dopant region 390 has a polarity opposite the polarity of photosensitive region 315: in the illustrated embodiment pure dopant region 390 is p-doped while photosensitive region 315 is n-doped, but in an embodiment where photosensitive region 315 is p-doped, pure dopant region 390 can be n-doped.

Figure 3C:
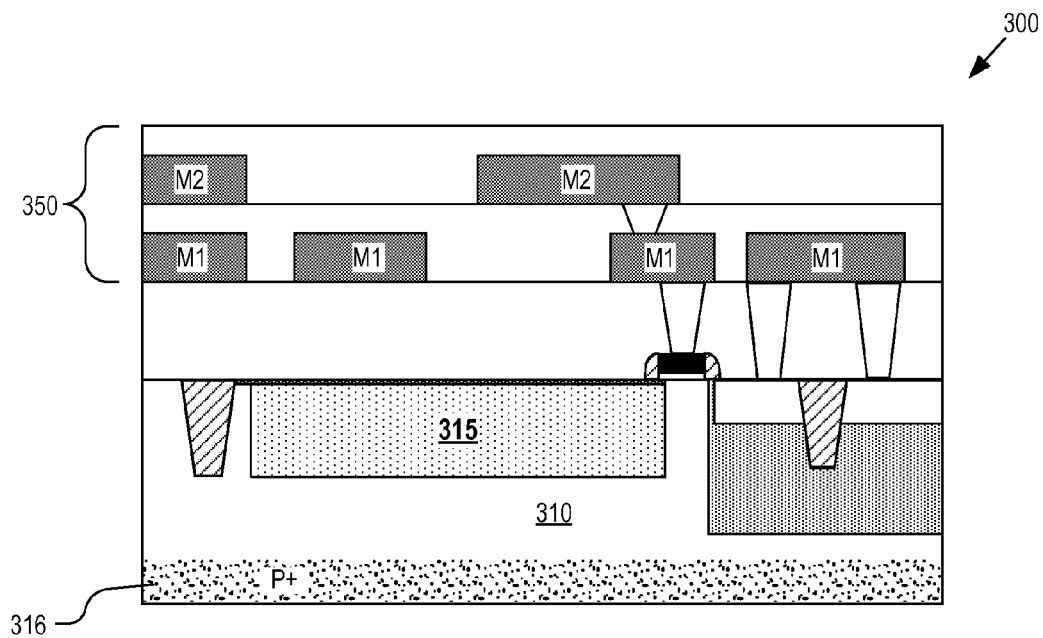
FIG. 3C is a cross-section view of a partially fabricated embodiment of a backside-illuminated image sensor fabricated up to the completion of the backside doped layer.

In process block 220, a PIII process similar to the one used in process block 215 can used to deposit a capping film 395 onto the backside of pure p-type dopant region 390 as shown in FIG. 3B. In one embodiment, capping film 395 can be polysilicon, but in other embodiments can be another form of silicon or another material altogether. In process block 225, a laser pulse is applied to melt capping layer 395 and the backside surface of p-type epi layer 310. Upon recrystallization of the p-type epi layer the pure dopant region 390 becomes incorporated into epi layer 310, resulting in very high dopant activation in backside p-doped layer 316, as shown in FIG. 3C. The laser pulse melts pure p-type dopant region 390 and capping film 395 within a few nanoseconds and backside p-type epi layer 310 recrystallizes within about 10 nanoseconds. When compared to the conventional method—ion implantation combined with a thermal laser anneal that can require minutes to activate the implanted ions—a shorter laser anneal period can decrease the depth of dopant diffusion and/or metal deterioration/melting due to a prolonged substrate temperature increase.

The depth of backside p+ doped layer 316 can be controlled by controlling the thickness of pure p-type dopant region 390; in various embodiments, backside p+ doped layer 316 can have a thickness between about 0.1 microns and about 0.3 microns. The dopant concentration of backside p+ doped layer 316 can be controlled by the duration and power of the laser pulse melt. In one embodiment the laser pulse can have a duration less than 10 nanoseconds, (ns), but in other embodiments can have a different duration. Similarly, in various embodiments, doped layer 316 can have dopant concentrations between $10^{18}$ and $10^{20}$ ions/cm$^3$, but of course other dopant concentrations are possible in other embodiments. After the melt and recrystallization, a p-type junction is formed on the backside of epi layer 310. There is no need to remove any film or layer after the laser pulse melt. In addition, using this process, the occurrence of crystal defects and inactive dopants may decrease.

Figure 3D:
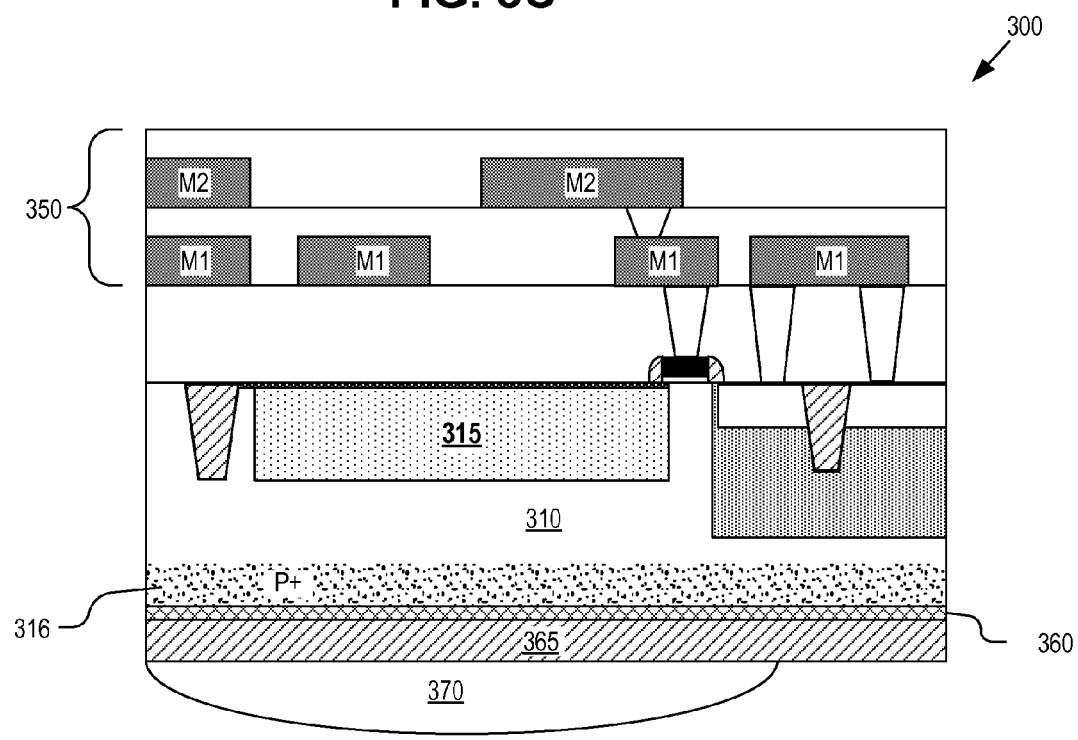
FIG. 3D is a cross-sectional view of a fabricated embodiment of a backside-illuminated pixel.

In process block 230, fabrication of image pixel 300 is completed with the addition of anti-reflective (AR) layer 360, color filter 365 and microlens 370, as shown in FIG. 3D. Note, FIGS. 1 and 3A-3D only show a cross-sectional of a single pixel within a pixel array. Accordingly, fabrication of an entire image sensor would include fabrication of an array of color filters 365 and an array of microlens 370, although though AR layer 360 can be a blanket layer shared by multiple repeated devices. It should be noted that the above description assumes implementation of image sensors using red, green and blue photosensitive elements. Those skilled in the art having benefit of the instant disclosure will appreciate that the description is also applicable to other primary or complementary color filters.

Figure 4:
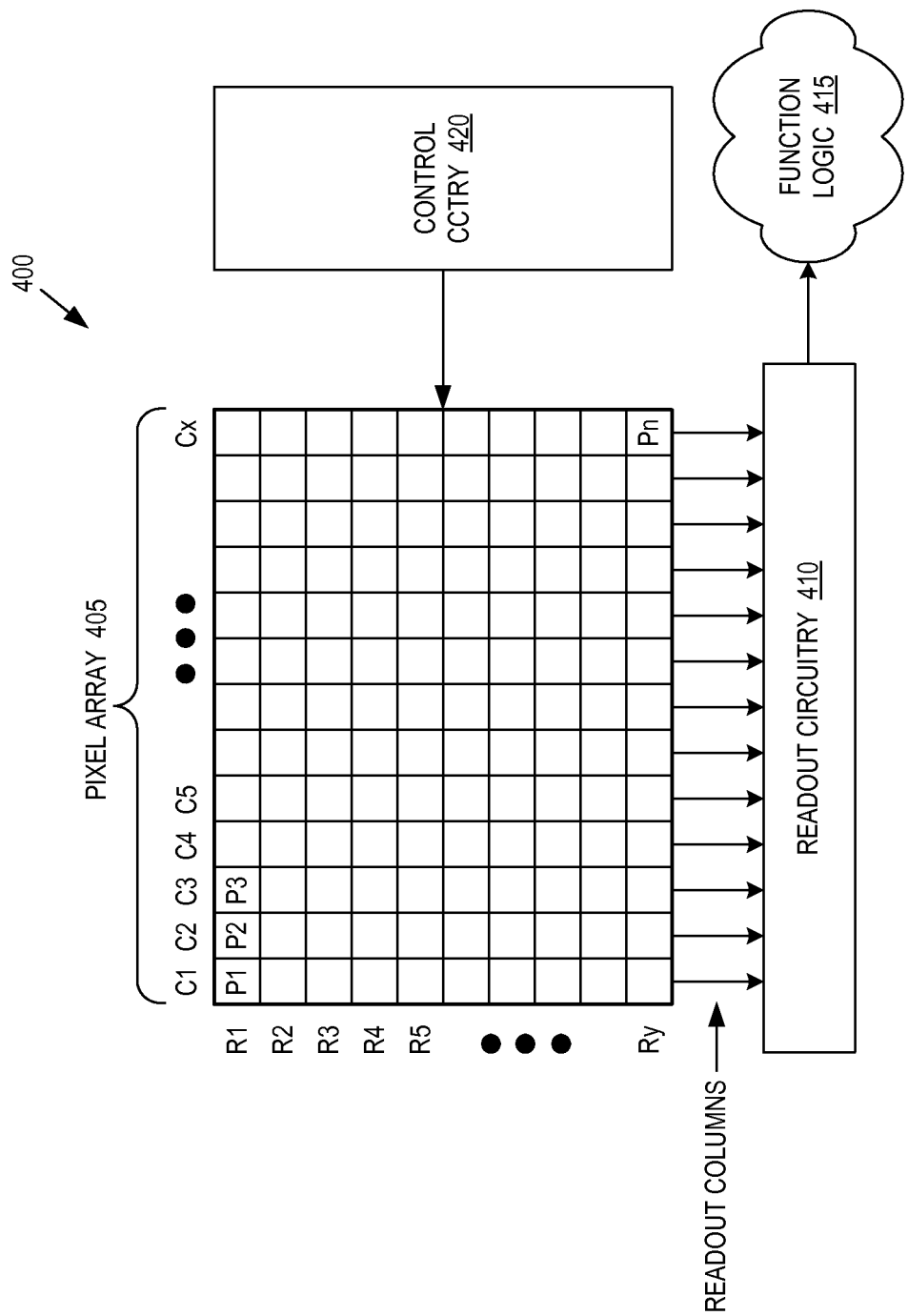
FIG. 4 is a block diagram illustrating an embodiment of a backside-illuminated image sensor.

FIG. 4 is a block diagram illustrating an embodiment of a BSI imaging system 400. The illustrated embodiment of imaging system 400 includes a pixel array 405, readout circuitry 410, function logic 415, and control circuitry 420.

Pixel array 405 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel and at least one pixel in the array can be one of the BSI pixel embodiments shown in FIGS. 1 and 3D. As illustrated, each pixel in the array is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 410 and transferred to function logic 415. Readout circuitry 410 can include amplification circuitry, analog-to-digital ("ADC") conversion circuitry, or otherwise. Function logic 415 can simply store the image data or even manipulate the image data by applying post image effects (e.g., crop, rotate, remove red eye, adjust brightness, adjust contrast, or otherwise). In one embodiment, readout circuitry 410 may read out a column of image data at a time along readout column lines (illustrated) or may readout the image data using a variety of other techniques (not illustrated), such as a serial readout or a full parallel readout of all pixels simultaneously.

Control circuitry 420 is coupled to pixel array 405 to control operational characteristic of pixel array 405. For example, control circuitry 420 can generate a shutter signal for controlling image acquisition. In one embodiment, the shutter signal is a global shutter signal for enabling all pixels within pixel array 405 to simultaneously capture their respective image data during a single acquisition window. In an alternative embodiment, the shutter signal is a rolling shutter signal whereby each row, column, or group of pixels is sequentially read out during consecutive acquisition windows.

Figure 5:
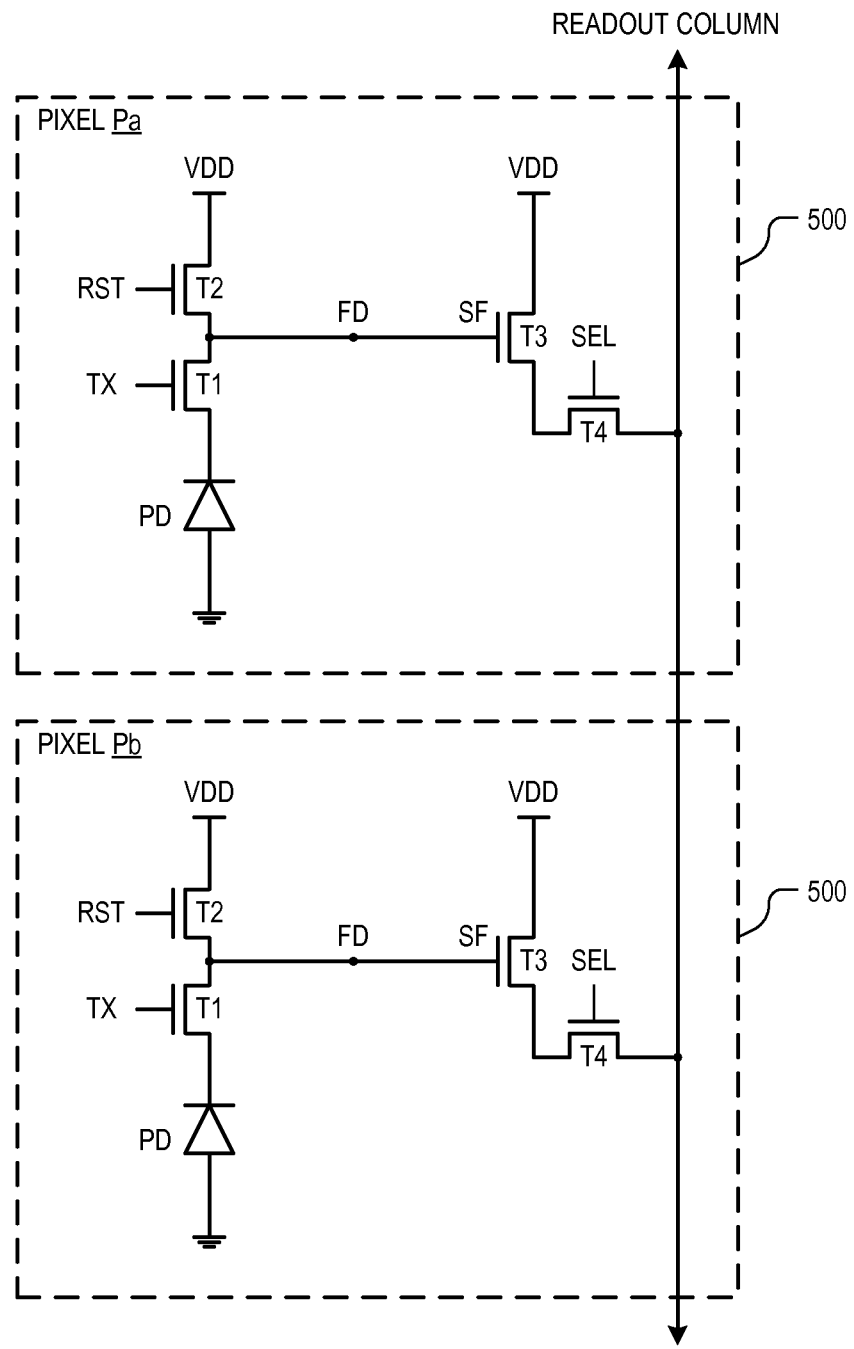
FIG. 5 is a circuit diagram illustrating pixel circuitry of two four-transistor ("4T") pixels within an embodiment of a backside-illuminated imaging array.

FIG. 5 is a circuit diagram illustrating an embodiment of pixel circuitry 500 of two four-transistor ("4T") pixels within a BSI imaging array, in accordance with an embodiment of the invention. Pixel circuitry 500 is one possible pixel circuitry architecture for implementing each pixel within pixel array 405 of FIG. 4, but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 5, BSI pixels Pa and Pb are arranged in two rows and one column. The illustrated embodiment of each pixel circuitry 500 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD can be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 500 to the readout column line under control of a select signal SEL. In one embodiment, the TX signal, the RST signal, and the SEL signal are generated by control circuitry 420.

The above description of illustrated embodiments of the invention, including what is described in the abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. A method of fabricating a backside-illuminated pixel, the method comprising:
   forming frontside components of the pixel on or in a front side of a substrate, the frontside components including a photosensitive region of a first polarity;
   depositing a pure dopant layer of a second polarity on a back surface of the substrate;
   depositing a capping film on the back side of the pure dopant region;
   applying a laser pulse to melt the pure dopant layer, the capping film, and the back surface of the substrate; and
   recrystallizing the melted pure dopant layer, the melted capping film, and the melted backside of the substrate, wherein the recrystallized dopant layer, capping film and backside form a backside doped region of the substrate.

2. The method of claim 1 wherein the capping film is polysilicon.

3. The method of claim 1 wherein depositing the pure dopant region comprises depositing the dopant with a Plasma Immersion Ion Implantation ("PIII") process.

4. The method of claim 1 wherein the substrate is an epitaxial substrate with a polarity opposite the polarity of the photosensitive region.

5. The method of claim 1 wherein the doped layer has the same polarity but a different dopant concentration than the substrate.

6. The method of claim 1 wherein the laser pulse has a duration less than about 10 ns.

\* \* \* \* \*